United States Patent [19]
Ekrot et al.

[11] Patent Number: 5,772,448
[45] Date of Patent: Jun. 30, 1998

[54] EDGECARD CIRCUIT BOARD

[75] Inventors: Alexander Craig Ekrot, Humble; Bassam Nakhle Elkhoury, Spring, both of Tex.

[73] Assignee: Compaq Computer Corporation, Houston, Tex.

[21] Appl. No.: 631,606

[22] Filed: Apr. 2, 1996

[51] Int. Cl.⁶ ..................................................... H01R 9/09
[52] U.S. Cl. ........................................... 439/60; 439/951
[58] Field of Search ............................. 439/60, 59, 636, 439/637, 951

[56] References Cited

U.S. PATENT DOCUMENTS

| | | | |
|---|---|---|---|
| 3,160,455 | 12/1964 | Mayon et al. | 439/60 |
| 3,858,957 | 1/1975 | Harwood et al. | 439/59 |
| 4,018,495 | 4/1977 | Freitag | 439/55 |
| 4,303,291 | 12/1981 | Dines | 439/59 |
| 4,736,275 | 4/1988 | Kendall et al. | 439/59 |
| 4,806,103 | 2/1989 | Kniese et al. | 439/60 |
| 5,236,372 | 8/1993 | Yunoki et al. | 439/60 |
| 5,270,903 | 12/1993 | McMichen et al. | 439/55 |
| 5,468,920 | 11/1995 | August | 439/59 |
| 5,492,478 | 2/1996 | White | 439/637 |

FOREIGN PATENT DOCUMENTS 2 642 607  8/1990  France .
1-128379   5/1989  Japan .

OTHER PUBLICATIONS

Robert Bendorf, "AMP High Speed Standard Edge Connector, Land Configurations", Dec. 12, 1995, AMP Incorporated.

"Connector Assembly, Dual Position, High Speed, Standard Edge" (Doc. No. 536249), Jun. 17, 1994, AMP Incorporated.

*Primary Examiner*—Neil Abrams
*Assistant Examiner*—T. C. Patel
*Attorney, Agent, or Firm*—Hickman Beyer & Weaver, LLP

[57] ABSTRACT

A printed circuit board that includes contact slider regions between conductive pads on the printed circuit board is disclosed. The printed circuit board is particularly suited for high density situations. According to one embodiment, a printed circuit board according to the invention includes a connection edge for insertion into a connector, a first row of conductive pads disposed on one or both sides of the printed circuit board proximate to the connection edge and extending away therefrom in a predetermined direction, and a row of slider regions disposed on one or both sides of the printed circuit board proximate to the connection edge and extending away therefrom in the predetermined direction, the slider regions being interposed between the conductive pads of the first row. The printed circuit board according to the invention is not only more reliable and easier to manufacture, but it also wears substantially better than previously designed high density circuit boards.

19 Claims, 6 Drawing Sheets

EDGECARD CIRCUIT BOARD

BACKGROUND OF THE INVENTION

1. Field of the Invention

The present invention relates to printed circuit boards and, more particularly, to printed circuit boards for use with edgecard connectors.

2. Description of the Related Art

Today, printed circuit boards (PCBs) are commonly connected to connectors. One popular example is the connection of an edgecard connector to a main PCB and then the connection of a smaller daughter PCB into the edgecard connector. These connectors are known as edgecard connectors because they receive an edge of the daughter PCB into the connector. In this situation, the daughter PCB is also known as an edgecard circuit board. The edgecard connector thus serves to electrically connect the main PCB with the daughter PCB.

In some implementations, the number of electrical connections to be made between the main PCB and the daughter PCB through the edgecard connector is extremely large and requires that contacts of the edgecard connector and the daughter PCB be very close together. When such high density contacts are required, manufacturing of the boards becomes particularly difficult due to strict tolerances. In addition, the number of insertions/removals that the daughter PCB can reliably withstand drops off substantially when the PCB includes high density conductive pads (contacts). Thus, there is a need for an improved daughter PCB which is easy to manufactured (e.g., reduced tolerances and better yield) and has a long useful life (e.g., higher number of reliable insertions/removals) even when high density conductive pads are required.

FIG. 1A is a top view of an edgecard connector 2. As an example, the edgecard connector 2 could be an AMP High Speed Edge Connector (part no. 1-536249-9). The edgecard connector 2 includes a housing 4, a slot 6, flexible contacts 8, and pins 10. The slot 6 receives a mating PCB (i.e., daughter PCB). The mating PCB is known as an edgecard circuit board. The flexible contacts 8 mechanically and electrically couple to corresponding contacts (pads) on the mating PCB when the mating PCB is fully inserted into the slot 6. Preferably, the flexible contacts 8 (at least the tips thereof) are phosphor-bronze plated contacts.

FIG. 1B illustrates the side view of edgecard connector 2. The bottom portion of the housing 4 of the edgecard connector 2 couples to a main PCB using the pins 10 and posts 12. The posts 12 mechanically aligns the edgecard connector 2 with the main PCB and also supports the edgecard connector 2. The pins 10 are placed into holes in the main PCB to electrically connect wiring on the main PCB to the flexible contacts 8 of the edgecard connector 2.

FIG. 1C is a cross-sectional view of the edgecard connector 2. As illustrated in FIG. 1C, the flexible contacts 8 include a lower row of contacts 14 and an upper row of contacts 16. By providing the lower row and the upper row of contacts 14 and 16, the edgecard connector 2 and the mating PCB can support a greater number of contacts.

FIG. 2 is a diagram of an edgecard circuit board 18. The edgecard circuit board 18 is a PCB suitable for insertion in the edgecard connector 2. The edgecard circuit board 18 has a lower edge 20 which is the initial surface that is inserted into the edgecard connector 2. The edgecard circuit board, 18 includes a lower row 22 of conductive pads 24 and an upper row 26 of conductive pads 28. Both of these rows 22 and 26 are proximate to the lower edge 20 of the edge card connector board 18. The conductive pads 28 of the upper row 26 are staggered with respect to the conductive pads 24 of the lower row 22. The portions of the conductive pads 28 that are closest to the lower edge 20 are narrowed and placed between the conductive pads 24 of the lower row 22. Hence, the conductive pads 24 and 28 of the first and second rows 22 and 26 both extend down to the lower edge 20 of the edge card connector board 18.

To insert the edgecard circuit board 18 into the edgecard connector 2, one forces the edgecard circuit board 18 downward in a direction D (as shown in FIG. 2) into the slot 6 of the edgecard connector 2 (in this case the edgecard connector 2 would be oriented as shown in FIG. 1B). Initially, the narrowed portions of the conductive pads 28 couple to the upper contacts 16 of the edgecard connector 2 and slide along the narrowed portions of the conductive pads 28 while the edgecard circuit board 18 is being inserted. When the edgecard circuit board 18 is about half way inserted, the upper contacts 16 are still on the narrowed portions of the conductive pads 28 and the lower contacts 14 couple to the conductive pads 24 on the edgecard circuit board 18. When the edgecard circuit board 18 reaches its final position, the upper contacts 16 of the edgecard connector 2 are now on the thick portions of the conductive pads 28 of the upper row 26 and the lower contacts 14 of the edgecard connector 2 are on the conductive pads 24 of the lower row 22.

The conventional approach illustrated in FIGS. 1A–1C and FIG. 2 has certain problems that makes implementation of high-density edgecard connectors problematic. One problem is that when edgecard circuit boards 18 are inserted into or removed from edgecard connectors 2, they tend to be rocked back and forth which can cause the upper conductive pads 28 within the edgecard connector 2 to fall off the narrowed portions of upper conductive pads 28. When this happens, the upper contacts 16 of the edgecard connector 2 can become stuck between the narrowed portions of the conductive pads 28 and the adjacent conductive pads 24 on the edgecard circuit board 18, which damages the upper contacts 16 of the connectors. Furthermore, the rocking action during insertion and removal of the edgecard circuit board 2 can also cause the narrowed portions of the conductive pads 28 to short circuit with adjacent conductive pads 24. Specifically, the narrowed portions from the conductive pads 28 of the edgecard connector board 18 or the conductive pads 24 of the edgecard connector 2 can flake off tiny particles of gold which tend collect between the adjacent conductive pads on the edgecard circuit board 18. The collection of these particles can cause the adjacent conductive pads to short together which causes damage the circuitry on the edgecard circuit board.

Thus, there is a need for an edgecard circuit board that is more suitable for high density implementations.

SUMMARY OF THE INVENTION

Broadly speaking, the invention is an edgecard circuit board that forms contact slider regions between conductive pads on the edgecard circuit board. The edgecard circuit board is particularly suited for high density situations. The invention can be implemented in numerous ways, including as an apparatus or a method. Several embodiments of the invention are described below.

A printed circuit board according to one embodiment of the invention includes a connection edge for insertion into a connector, a first row of conductive pads disposed on one or both sides of the printed circuit board proximate to the connection edge and extending away therefrom in a predetermined direction, and a row of slider regions disposed on one or both sides of the printed circuit board proximate to the connection edge and extending away therefrom in the predetermined direction, the slider regions being interposed between the conductive pads of the first row.

A printed circuit board according to another embodiment of the invention includes a connection edge for insertion into an edgecard connector in an insertion direction; a first row of metal conductive pads disposed on one or both sides of the printed circuit board adjacent to the connection edge and extending away therefrom in a direction opposite the insertion direction; a second row of metal conductive pads disposed on one or both sides of the printed circuit board adjacent to the first row of metal conductive pads and extending away therefrom in a direction opposite the insertion direction, the metal conductive pads of the second row being staggered with respect to the metal conductive pads of the first row; and a row of solder mask regions disposed on one or both sides of the printed circuit board adjacent to the connection edge and extending away therefrom in a direction opposite the insertion direction, the solder mask regions being interposed between the metal conductive pads of the first row so that each of the solder mask regions are in line with one of the metal conductive pads of the second row in the direction opposite the insertion direction.

A printed circuit board according to another embodiment of the invention includes a connection edge for insertion into an edgecard connector in an insertion direction; a first row of metal conductive pads disposed on one or both sides of the printed circuit board adjacent to the connection edge and extending away therefrom in a direction opposite the insertion direction; a second row of metal conductive pads disposed on one or both sides of the printed circuit board adjacent to the first row of metal conductive pads and extending away therefrom in a direction opposite the insertion direction, the metal conductive pads of the second row being staggered and isolated from the metal conductive pads of the first row; and a row of electrically isolated conductive regions disposed on one or both sides of the printed circuit board adjacent to the connection edge and extending away therefrom in a direction opposite the insertion direction, the electrically isolated conductive regions being interposed between the metal conductive pads of the first row so that each of the electrically isolated conductive regions are in line with one of the metal conductive pads of the second row in the direction opposite the insertion direction, the electrically isolated conductive regions also being electrically isolated from the metal conductive pads of the first and second rows.

As a method for fabricating a printed circuit board having conductive pads proximate to an edge of the printed circuit board, the method includes the operations of: fabricating a first row of conductive pads proximate to the edge of the printed circuit board; fabricating a second row of conductive pads proximate to the first row of the printed circuit board, the conductive pads of the second row being staggered from the conductive pads of the first row; and fabricating slider regions between the conductive pads of the first row and in line with the conductive pads of the second row.

The advantages of the invention are numerous. The printed circuit board according to the invention is not only more reliable and easier to manufacture, but it also wears substantially better than previously designed high density circuit boards. The connector to which the printed circuit board is inserted also wears better and therefore enjoys a longer useful life.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

Several representative embodiments of the invention are described in detail below. However, before describing the invention in detail, it is helpful to understand the problematic nature of a conventional high density edgecard circuit board. In particular, the difficulty of keeping upper conductive pads of a connector on narrowed conductive pads of the edgecard circuit board during insertion of the edgecard circuit board into the connector is examined and explained with reference to FIG. 3.

Figure 2:
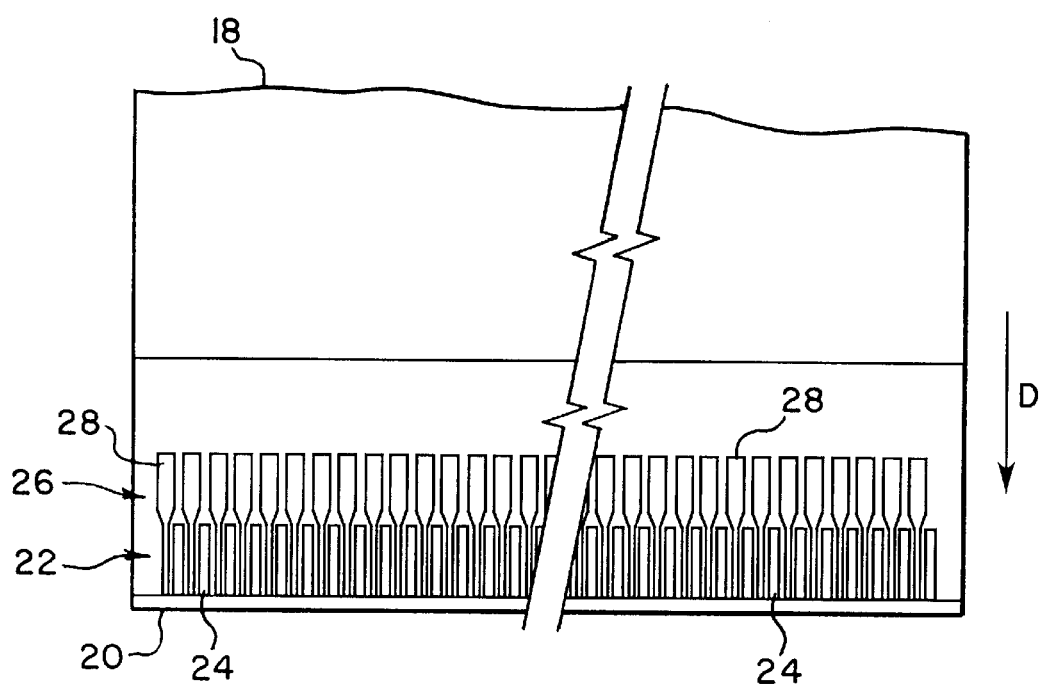
FIG. 2 is a diagram of a convention edgecard circuit board.
Figure 3:
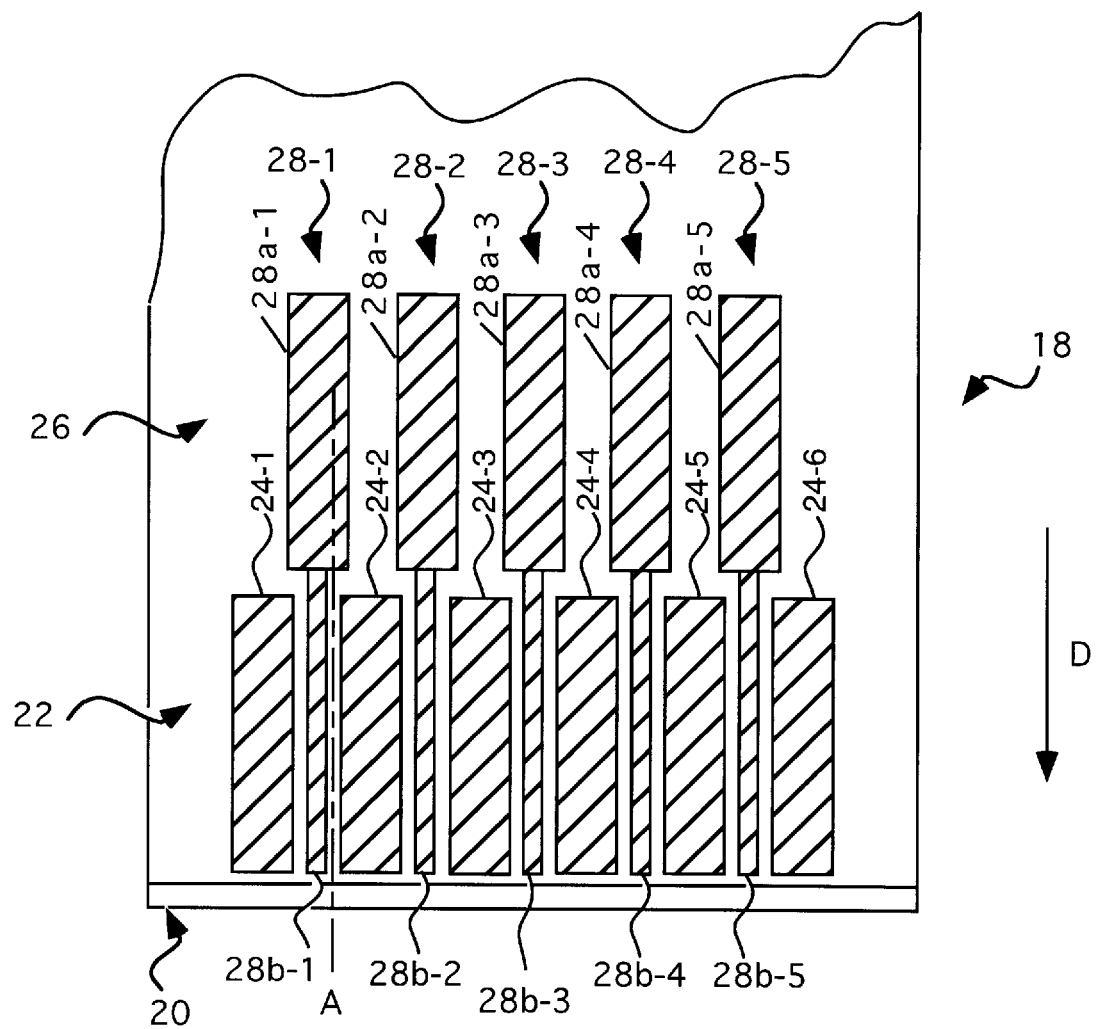
FIG. 3 is a detailed diagram illustrating a representative portion of the lower and upper rows of conductive pads on the conventional edgecard circuit board illustrated in FIG. 2.

FIG. 3 is a detailed diagram illustrating a representative portion of the lower and upper rows 22 and 26 of conductive pads on the conventional edgecard circuit board 18 illustrated in FIG. 2. The lower row 22 of conductive pads 24 illustrated in FIG. 3 includes conductive pads 24-1 through 24-6. These conductive pads 24-1 through 24-6 are positioned near the lower edge 20 of the edgecard circuit board 18 and extend upward away from the lower edge 20. In other words, the conductive pads 24-1 through 24-6 extend up from the lower edge 20 in the direction which is opposite the insertion direction D. The upper row 26 of conductive pads 28 illustrated in FIG. 3 includes conductive pads 28-1 through 28-5. The conductive pads 28-1 through 28-5 are staggered between the conductive pads 24-1 through 24-6 of the first row 22.

Each of the conductive pads 28-1 through 28-5 has an upper portion and a lower portion. The lower portion is thinned or narrowed relative to the upper portion. More particularly, the conductive pad 28-1 includes an upper portion 28*a*-1 and a lower portion 28*b*-1, the conductive pad 28-2 includes an upper portion 28*a*-2 and a lower portion 28*b*-2, the conductive pad 28-3 includes an upper portion 28*a*-3 and a lower portion 28*b*-3, the conductive pad 284 includes an upper portion 28a4 and a lower portion 28*b*4, and the conductive pad 28-5 includes an upper portion 28*a*-5 and a lower portion 28*b*-5. The lower portions 28*b*-1 through 28b-5 are closer to the lower edge 20 than their respective upper portions 28a-1 through 28a-5. Additionally, the lower portions 28b-1 through 28b-5 are adjacent to the lower edge 20 and extend upward away from the lower edge 20 (i.e., in the direction opposite to the insertion direction D) between adjacent pairs of the conductive pads 24-1 through 24-6.

The reference line shown in PIG. 3 illustrates how an upper contact 16 within the edgecard connector 2 (FIGS. 1A–1C) travels on the contact region of the edgecard circuit board 18 as the edgecard circuit board 18 is inserted into the edgecard connector 2. The upper contact 16 may follow the path indicated by a reference line A during insertion of the edgecard circuit board 18 into the edgecard connector 2. The path indicated by the reference line A is not the desired path, but is the undesired, problematic path followed when the strict tolerances are slightly off or when the edgecard circuit board 18 is rocked during insertion. Notice that the reference line A is between the lower portion 28b-1 and the conductive pad 24-2, but that once the edgecard circuit board 18 is fully inserted, the reference line A is over the conductive pad 28a-1.

Several problems arise when the insertion of the edgecard circuit board 18 causes the upper contact 16 to follow the path indicated by the reference line A. First, the upper contact 16 within the edgecard connector 2 travels along the abrasive surface of the edgecard circuit board 18 itself. The abrasive surface of the edgecard circuit board 18 is typically FR-4 epoxy-fiberglass. The upper contact 16 is supposed to travel on the narrowed portion 28b-1 of the conductive pad 28-1, not the abrasive surface of the edgecard circuit board 18. Nevertheless, when this occurs, the upper contact 16 wears very rapidly and the useful life and reliability of the edgecard connector 2 are jeopardized. Second, sometimes the insertion of edgecard circuit board 18 into the edgecard connector 2 is not fully achieved prior to powering up the devices. When the edgecard circuit board 18 is only partially inserted into the edgecard connector 2 and when one or more upper contacts 16 within the edgecard connector 2 are not traveling along the appropriate narrowed portions 28b but are instead riding along the abrasive surface of the edgecard circuit board 18, the one or more upper contact 16 could potentially either short together the narrowed portion 28b with the adjacent conductive pad 24, or undesirably couple to the adjacent conductive pad 24. For example, the upper contact 16 roughly following the path A could actually couple to the narrowed portion 28b-1, the conductive pad 24-2, or both. Hence, the operation of the edgecard circuit board 18 is not reliable and in fact can be damaged depending upon how the connection is actually made.

The invention is an edgecard circuit board that forms slider regions between conductive pads near an edge of the edgecard circuit board. The slider regions minimize damage to a connector and/or the edgecard circuit board when the edgecard connector board is inserted into the connector. The edgecard circuit board according to the invention is particularly suited for high density situations.

Embodiments of the invention are discussed below with reference to FIGS. 4–7B. However, those skilled in the art will readily appreciate that the detailed description given herein with respect to these figures is for explanatory purposes as the invention extends beyond these limited embodiments.

Figure 4:
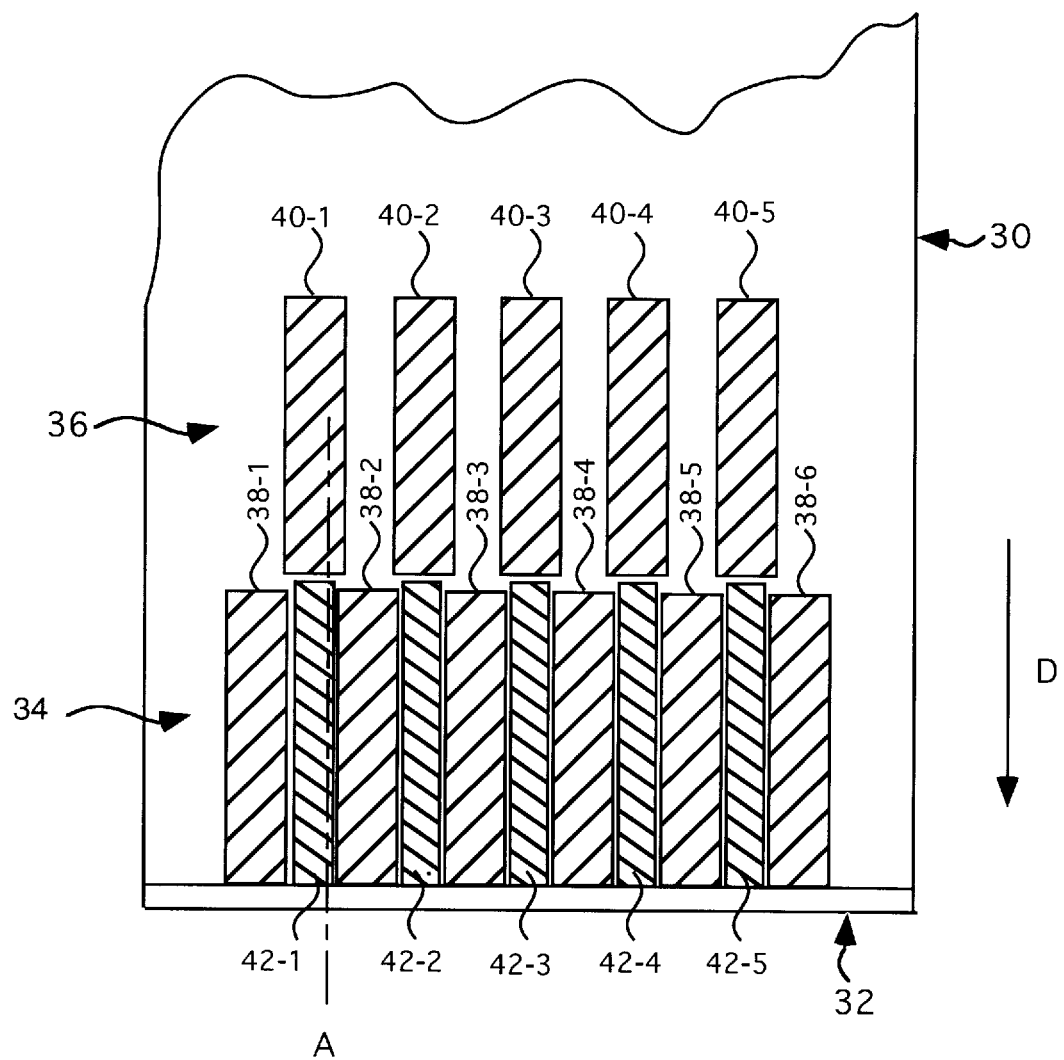
FIG. 4 is a diagram an edgecard circuit board according to a first embodiment of the invention.

FIG. 4 is a diagram an edgecard circuit board 30 according to a first embodiment of the invention. The edgecard circuit board 30 includes a lower edge 32 near which first and second rows 34 and 36 of conductive pads are placed. The first row 34 includes conductive pads 38-1 through 38-6 adjacent to the lower edge 32. The second row 36 includes conductive pads 40-1 through 40-5 which are proximate to the lower edge 32. More particularly, the conductive pads 40-1 through 40-5 are offset from the lower edge 32 by the length of the conductive pads 38-1 through 38-6 of the first row. The first and second rows 34 and 36 can be considered lower and upper rows, respectively. The conductive pads 40-1 through 40-5 of the second row 36 are also staggered respectively between the conductive pads 38-1 through 38-6. The staggering of the first and second rows 34 and 36 allows greater numbers of conductive pads to be placed near the lower edge 32 as is common in high density edgecard circuit boards. Further, between each of the adjacent pairs of the conductive pads 38-1 through 38-6 are slider regions 42-1 through 42-5. These slider regions 42-1 through 42-5 are aligned with the conductive pads 40-1 through 40-5, respectively, and extend from the lower edge 32 up to the bottom portion (i.e., portion nearest to the lower edge 32) of the conductive pads 40-1 through 40-5. The slider regions 42-1 through 42-5 are significantly less abrasive than the abrasive surface of the edgecard circuit board 30. Consequently, contacts of a connector "slide" along the smooth, low abrasive surface of the slider regions 42-1 through 42-5. Preferably, the slider regions 42-1 through 425 are formed of solder mask. Solder mask has a smooth, low abrasive surface and can easily be formed on the edgecard circuit board 30 with precision. Alternatively, the slider regions 42-1 through 42-5 can be formed of electrically isolated conductive contacts which also have a smooth, low abrasive surface and can easily be formed on the edgecard circuit board 30 with precision. The discussion below concentrates on the case in which the slider regions 42-1 through 42-5 are formed of solder mask.

The conductive pads 38 and 40 are preferably gold-plated. More specifically, the conductive pads 38 and 40 are preferably formed from a stack of thin layers of metals. The stack preferably includes a first layer of copper, then a layer of titanium, then a layer of nickel, and finally a layer of gold. Since the top most layer is gold, the conductive pads 38 and 40 are referred to a gold-plated conductive pads.

The slider regions 42 can be placed on the surface of the edgecard circuit board 30 either before or after the conductive pads 38 and 40 are placed on the edgecard circuit board 30. Preferably, the slider regions 42 are formed from solder mask. The process of forming the solder mask on the edgecard circuit board 30 is well known by those in the field of production of PCBs. The thickness of the solder mask regions is typically between ½ to 3 mils but other values could also be used depending upon the particular design of the edgecard circuit board 30. The thickness of the conductive pads 38 and 40 is typically on the order of 4 to 6 mils. Hence, the solder mask is typically ½ mil below the height of the conductive pads 38 and 40. With very densely placed conductive pads, it is preferable that the solder mask regions have a height (thickness) slightly less than the height of the conductive pads 38 and 40 because if the height of the solder mask regions were higher then the contacts (lower or upper) of a connector might be caught on the solder mask regions and therefore not couple with the appropriate conductive pads. However, in certain embodiments, it may be appropriate to have the solder mask regions have a height greater than the height of the conductive pads for providing a channeling effect.

Figure 1A:
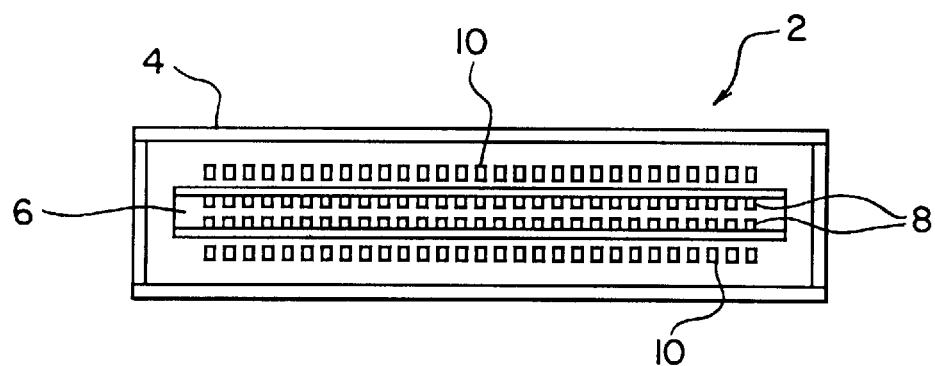
FIGS. 1A–1C are diagrams of a conventional edgecard connector.
Figure 1B:
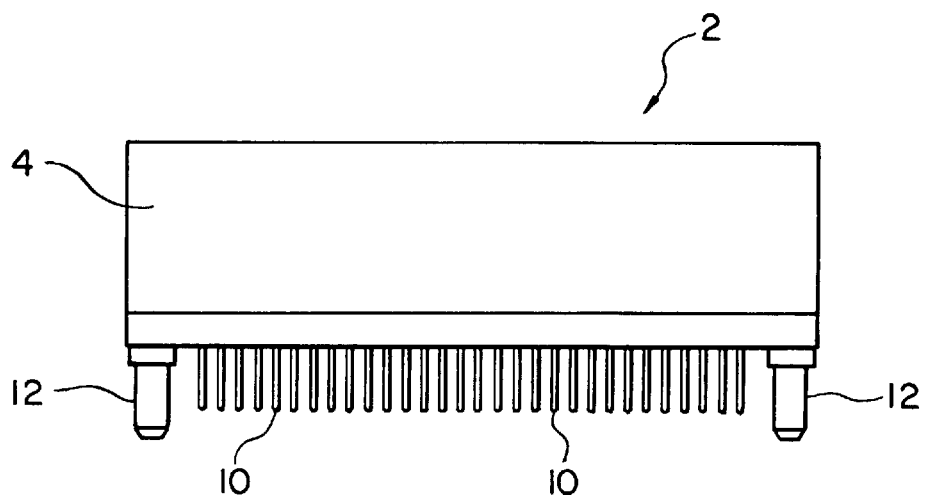
Figure 1C:
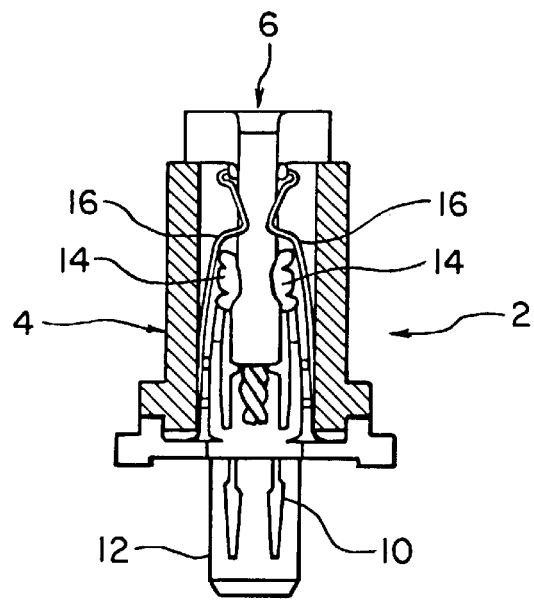

The insertion of the edgecard circuit board 30 according to the invention into a connector, such as the edgecard connector 2 illustrated in FIGS. 1A–1C, in an insertion direction D operates as follows. Initially, when the edgecard circuit board 30 is inserted, an upper row of contacts (e.g., contacts 16) of the connector contacts the lower portion of the slider regions 42-1 through 42-5. The lower portion of the slider regions 42-1 through 42-5 is that portion adjacent or nearest the lower edge 32. As the edgecard circuit board 30 is f further forced into the connector, the upper row of contacts (e.g., contacts 16) slide or travel along the slider regions 42-1 through 42-5. When the insertion of the edgecard circuit board 30 is about half way completed, the upper row of contacts reach the vicinity of the bottom portion of the conductive pads 40-1 through 40-5, and the lower row of contacts (e.g., contacts 14) of the connector reach the vicinity of the bottom portion (i.e., portion nearest the lower edge 32) of the conductive pads 38-1 through 38-6. Thereafter, when the edgecard circuit board 30 is still further forced into the connector, the lower row of contacts of the connector slide or travel onto the conductive pads 38-1 through 38-6 and the upper row of contacts of the connector traverse from the slider regions 42-1 through 42-5 to the conductive pads 40-1 through 40-5, respectively. Thereafter, when the edgecard circuit board 30 is fully inserted, the lower row of contacts of the connector couple to a central portion of the conductive pads 38-1 through 38-6 and the upper row of contacts of the connector couple to a central portion of the conductive pads 40-1 through 40-5.

Thus, with respect to the reference line A shown in FIG. 4, which is oriented to the edgecard circuit board the same as it was in FIG. 3, the edgecard circuit board 30 according to the invention operates in a substantially more favorable manner to overcome the problems of conventional high-density edgecard circuit boards.

First, the upper row of contacts (e.g., contacts 16) of the connector now slide or travel against the low abrasive material of the slider regions 42-1 through 42-5. The slider regions 42-1 through 42-5 have a smooth, low abrasive surface, and therefore, cause only minimal wear to the contacts during insertion and extraction of the edgecard circuit board 30 to and from the connector.

Second, in the case in which the edgecard circuit board 30 is not fully inserted into the connector when power is supplied to the edgecard circuit board 30, the slider regions 42-1 through 42-5 operate as insulative or electrically isolated materials so as to prevent any shorting of the conductive pads 40-1 through 40-5 or other unintended connections. Hence, in this case, the edgecard connector 30 not only prevents shorting, but also prevents the edgecard circuit board 30 from operating properly when it is not fully inserted, thereby signaling a user that a problem exists. Upon inspection, the user can determine that the edgecard circuit board 30 is not fully inserted. Thus, when the edgecard circuit board 30 is powered-up while being only partially inserted, no damage occurs to the edgecard circuit board 30.

Third, the use of the slider regions 42-1 through 42-5 also significantly improves the wear and useful life of the contacts of the connector because the number of the metal edges that the contacts must traverse is minimized in the case in which solder mask is used for the slider regions 42-1 through 42-5. Namely, according to the invention, only a single metal edge traversal would be required for the upper row of contacts of the connector. The single metal edge occurs at the transition point between the top of the slider regions 42-1 through 42-5 and the bottom portion of the conductive pads 40-1 through 40-5. On the removal of the edge card connector board 30 from the connector, the upper row of contacts would not traverse any metal edge transitions. Likewise, the lower row of contacts of the connector traverse a single metal edge during insertion and no metal edges during removal. By thus minimizing the number of metal edges the upper row of contacts must traverse, the edgecard circuit board 30 decreases the likelihood that gold particles will break off from the upper row of contacts or the bottom edge of the conductive pads 40-1 through 40-5 and deposit themselves between adjacent conductive pads which can lead to short circuits or other undesired connections.

A fourth advantage of the invention is that tolerances for the conductive pads can be relaxed because the contacts of a connector no longer must be designed to properly align with narrowed lower portions of conductive pads. The narrowed lower portions (FIG. 3, 28b) conventionally used in many edgecard circuit boards are no longer needed with the edgecard circuit board according to the invention. Moreover, the tolerance of the location and width of an alignment slot for the edgecard circuit board is also relaxed. As a result, it is substantially easier to manufacture edgecard circuit boards within the relaxed tolerance ranges, thus providing better yields and less expensive manufacturing.

Consequently, the edgecard circuit board 30 according to the invention is not only safer, more reliable and easier to manufacture, but it also wears substantially better than previously designed high density edgecard circuit boards. Furthermore, not only does the edgecard circuit board 30 according to the invention last longer and operate more reliably, the connector to which the edgecard circuit board 30 is inserted also wears better and therefor enjoys a longer useful life.

As an alternative design, the conventional edgecard circuit board 18 illustrated in FIG. 3 can be made equivalent to the edgecard circuit board 30 according to the invention by placing the slider regions 42-1 through 42-5 over the narrowed portions 28b-1 through 28b-5, respectively. In this alternative design, the slider regions 42-1 through 42-5 are formed from solder mask (the use of electrically isolated conductive contacts is not appropriate). However, this approach is not preferred because the placement of solder mask (as the slider regions) over the narrowed portions 28b does not adhere as well to the metal of the narrowed portions 28b as it does to the PCB (edgecard circuit board 30), thus effecting its useful life but not its operation.

Figure 5:
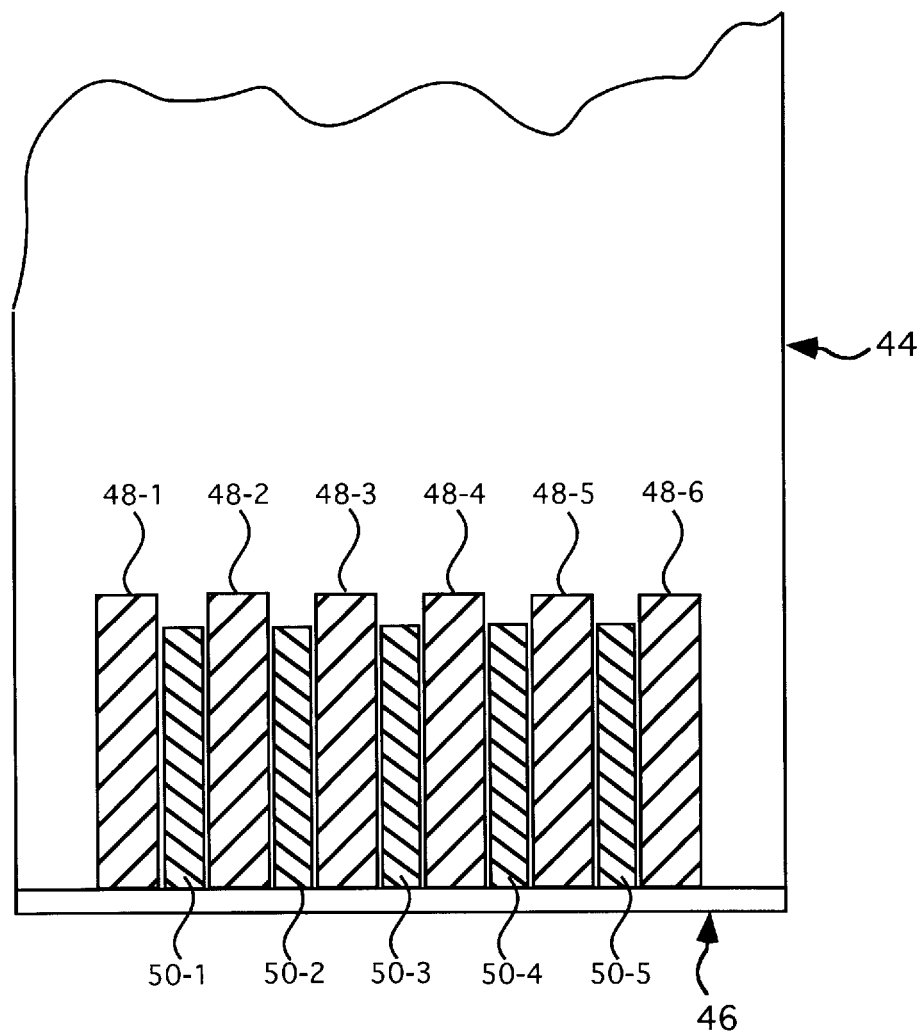
FIG. 5 is a diagram an edgecard circuit board according to a second embodiment of the invention.

FIG. 5 is a diagram an edgecard circuit board 44 according to a second embodiment of the invention. The edgecard circuit board 44 includes a lower edge 46 adjacent to which a row of conductive pads 48-1 through 48-6 are placed. Between each of the adjacent pairs of the conductive pads 48-1 through 48-6 are slider regions 50-1 through 5 05. These slider regions 50-1 through 50-5 are essentially the same as the slider regions 42-1 through 42-5 of FIG. 4, with the exception that the length need not extend beyond than the length of the conductive pads 48-1 through 48-6. In fact, as illustrated in FIG. 5, the length of the slider regions 50-1 through 50-5 can even be slightly less than the length of the conductive pads 48-1 through 48-6. With this embodiment, there are no upper row of contacts; hence, the only contacts of a connector that might "slide" along the smooth, low abrasive surface of the slider regions 50-1 through 50-5 are those contacts which deviate from their respective conductive pad 48-1 through 48-6. Such contacts tends to deviate from their intended corresponding conductive pads 48-1 through 48-6 due to rocking action (known as zippering) or unsatisfied tolerances. When this occurs, the slider regions 50-1 through 50-5 minimize damage to the wayward contacts and reduces the likelihood that the wayward contact will get stuck between adjacent conductive pads or otherwise damage (or prematurely wear) the conductive pads.

Figure 6:
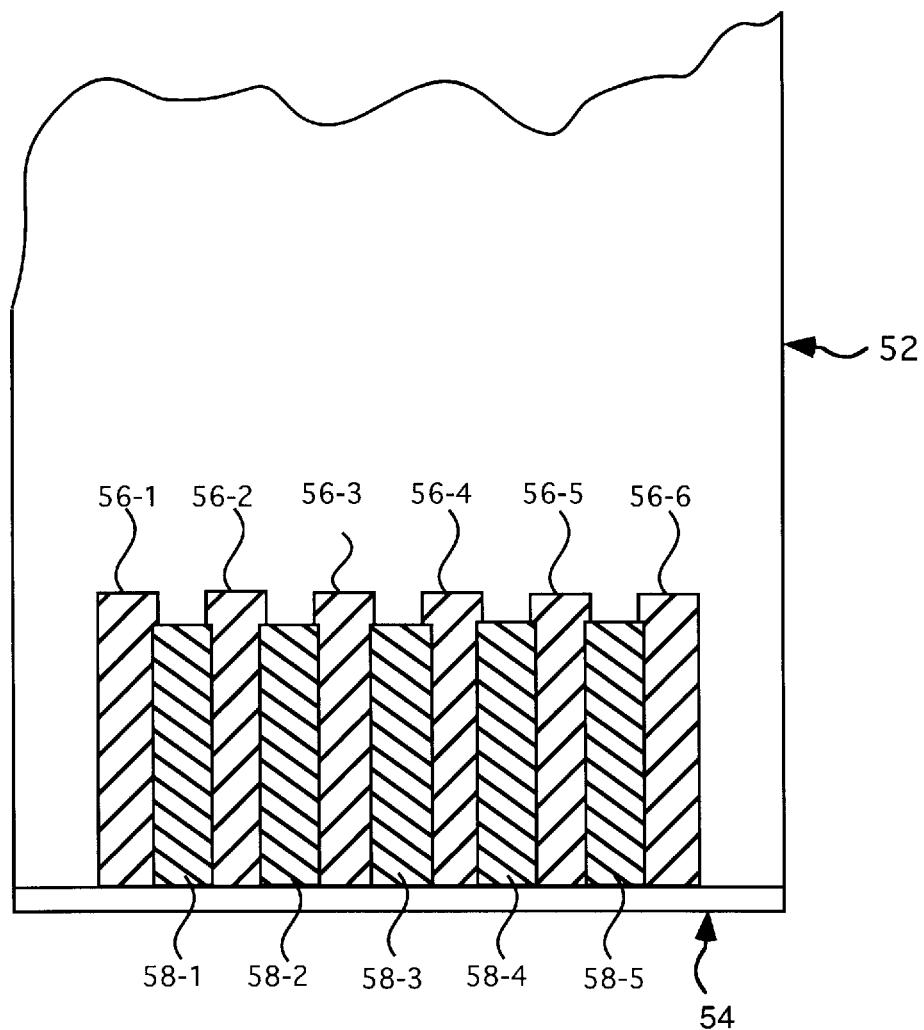
FIG. 6 is a diagram an edgecard circuit board according to a third embodiment of the invention.
Figure 7A:
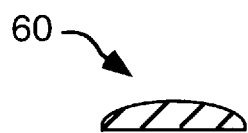
FIGS. 7A and 7B are cross sectional views of a representative curvatures for slider regions according to the invention.

FIG. 6 is a diagram an edgecard circuit board 52 according to a third embodiment of the invention. The edgecard circuit board 52 according to a third embodiment of the invention is generally similar to the edgecard circuit board 44 according to a second embodiment of the invention. The edgecard circuit board 52 includes a lower edge 54 adjacent to which a row of conductive pads 56-1 through 56-6 are placed. Between each of the adjacent pairs of the conductive pads 56-1 through 56-6 are slider regions 58-1 through 58-5. These slider regions 58-1 through 58-5 are essentially the same as the slider regions 50-1 through 50-5 of FIG. 5, with the exception that their width is extended just onto the adjacent sides of the conductive pads 56-1 through 56-6. In contrast, in the first and second embodiments, the slider regions did not contact with the adjacent conductive pads by instead a small (e.g., 3 mil gap) was maintained. Here, however, by extending the slider regions 58-1 through 58-5 just onto the adjacent sides of the conductive pads 56-1 through 56-6 can be helpful in steering or channeling those contacts which deviate from their respective conductive pad 56-1 through 56-6. Such contacts tends to deviate from their intended corresponding conductive pads 56-1 through 56-6 due to rocking action or unsatisfied tolerances. When this occurs, the slider regions 58-1 through 58-5 minimizes damage to the wayward contacts and reduces the likelihood that the wayward contact will get stuck between adjacent conductive pads. The steering or channeling can be enhanced by providing the slider regions 58-1 through 58-5 with a shape or curvature that directs the wayward contact to the appropriate adjacent conductive pad. FIG. 7A illustrates a cross sectional view of a representative curvature for the slider regions 58-1 through 58-5. Note that in this embodiment the slider regions 58-1 through 58-5 would be formed from solder mask, not conductive contacts, because a non-conductive material would be needed to prevent shorting together the conductive pads 56-1 through 56-6.

Figure 7B:
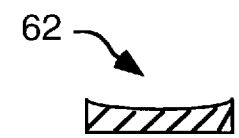

Moreover, FIG. 7B illustrates a cross sectional view of a representative curvature for the slider regions 42-1 through 42-5. Such curvature would help direct the upper contacts (e.g., contacts 16) of the connector 2 toward the middle of the slider regions 42-1 through 42-5 which serves to align the upper contacts with the bottom portion of the conductive pads 40-1 through 40-5. Hence, such steering or channeling may serve to reduce the likelihood that an upper contact would veer off the conductive pad 40 of the second row 36.

The many features and advantages of the present invention are apparent from the written description, and thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A printed circuit board for use with an edgecard connector, said printed circuit board comprising:
   a connection edge for insertion into an edgecard connector in an insertion direction;
   a first row of metal conductive pads disposed on one or both sides of said printed circuit board adjacent to said connection edge and extending away therefrom in a direction opposite the insertion direction;
   a second row of metal conductive pads disposed on one or both sides of said printed circuit board adjacent to said first row of metal conductive pads and extending away therefrom in a direction opposite the insertion direction, the metal conductive pads of sa id second row being staggered with respect to the metal conductive pads of said first row; and
   a row of solder mask regions disposed on one or both sides of said printed circuit board adjacent to said connection edge and extending away therefrom in a direction opposite the insertion direction, the solder mask regions being discrete regions interposed between the metal conductive pads of the first row so that each of the solder mask regions are in line with one of the metal conductive pads of said second row in the direction opposite the insertion direction, and the solder mask regions having a substantially uniform height a long the direction opposite the insertion direction.

2. A printed circuit board as recited in claim 1, wherein the solder mask regions have a convex cross-section.

3. A printed circuit board a s recited in claim 2, wherein the convex cross-section of solder mask regions operate to direct contacts of the edgecard connector to the corresponding conductive pads of said first row.

4. A printed circuit board as recited in claim 1, wherein the solder mask regions have a concave cross-section.

5. A printed circuit board as recited in claim 4, wherein the concave cross- section of the solder mask regions operate to channel contacts of the edgecard connector to the corresponding metal conductive pads of said second row.

6. A printed circuit board for use with an edgecard connector, said printed circuit board comprising:
   a connection edge for insertion into an edgecard connector in an insertion direction;
   a first row of metal conductive pads disposed on one or both sides of said printed circuit board adjacent to said connection edge and extending away therefrom in a direction opposite the insertion direction;
   a second row of metal conductive pads disposed on one or both sides of said printed circuit board adjacent to said first row of metal conductive pads and extending away therefrom in a direction opposite the insertion direction, the metal conductive pads of said second row being staggered and isolated from the metal conductive pads of said first row; and
   a row of electrically isolated conductive regions disposed on one or both sides of said printed circuit board adjacent to said connection edge and extending away therefrom in a direction opposite the insertion direction, the electrically isolated conductive regions being discrete regions interposed between the metal conductive pads of the first row so that each of the electrically isolated conductive regions are in line with one of the metal conductive pads of said second row in the direction opposite the insertion direction, the electrically isolated conductive regions also being electrically isolated from the metal conductive pads of the first and second rows, and the electrically isolated conductive regions having a substantially uniform height along the direction opposite the insertion direction.

7. A printed circuit board for use with a connector, said printed circuit board comprising:
   a connection edge for insertion into the connector;
   a first row of conductive pads disposed on one or both sides of said printed circuit board proximate to said connection edge and extending away therefrom in a predetermined direction;
   a second row of conductive pads disposed on one or both sides of said printed circuit board proximate to said first row of conductive pads and extending away therefrom in the predetermined direction; and a row of discrete slider regions disposed on one or both sides of said printed circuit board proximate to said connection edge and extending away therefrom in the predetermined direction, said slider regions being interposed between the conductive pads of said first row, wherein the connector includes a plurality of contacts, wherein the conductive pads of said second row are staggered with respect to the conductive pads of said first row, and each of the conductive pads of said second row is above, in the predetermined direction, one of said slider regions, and wherein said discrete slider regions am individually formed and provide low abrasive, non-conductive surfaces that are traversed, during insertion of said printed circuit board into the connector, by a plurality of the contacts of the connector that are to electrically connect to the conductive pads of said second row, and said discrete slider regions have a substantially uniform height along the predetermined direction.

8. A printed circuit board as recited in claim 7, wherein, during insertion of said printed circuit board into the connector, no ramping action is provided as the low abrasive, nonconductive surfaces are traversed.

9. A printed circuit board as recited in claim 7, wherein said slider regions comprise solder mask.

10. A printed circuit board as recited in claim 9, wherein the conductive pads of said first and second rows comprise a layer of gold.

11. A printed circuit board as recited in claim 9, wherein said slider regions have a convex cross-section which serves to direct contacts of the connector to the corresponding conductive pads of said first row.

12. A printed circuit board as recited in claim 9, wherein said slider regions have a concave cross-section which serves to channel contacts of the connector to the corresponding conductive pads of said second row.

13. A printed circuit board as recited in claim 7, wherein the height of said discrete slider regions is substantially the same height as the height of the conductive pads of said second row.

14. A printed circuit board as recited in claim 13, wherein the height of said discrete slider regions is about ½ to 3 mils and the height of the conductive pads of said second row is about 4 to 6 mils.

15. A method for fabricating a printed circuit board having conductive pads proximate to an edge of the printed circuit board, said method comprising:

(a) fabricating a first row of conductive pads proximate to the edge of the printed circuit board;

(b) fabricating a second row of conductive pads proximate to the first row of the printed circuit board, the conductive pads of the second row being staggered from the conductive pads of the first row; and (c) fabricating individual slider regions between the conductive pads of the first row and in line with the conductive pads of the second row, the individual slider regions provide low abrasive, non-conductive surfaces with a substantially uniform height over which certain contacts of a connector slide when the printed circuit board is inserted into the connector.

16. A method as recited in claim 15, wherein the printed circuit board is a high density edgecard circuit board, and wherein said fabricating (c) places the slider regions on the printed circuit board with a separation gap between the conductive pads of the first row adjacent thereto.

17. A method as recited in claim 15, wherein, during insertion of said printed circuit board into the connector, no ramping action is provided as the low abrasive, nonconductive surfaces of the slider regions are traversed.

18. A method as recited in claim 15, wherein the height of the slider regions is substantially the same height as the height of the conductive pads of the second row.

19. A method as recited in claim 18, wherein the height of the slider regions is about ½ to 3 mils and the height of the conductive pads of the second row is about 4 to 6 mils.

* * * * *